(12) United States Patent
Ishida et al.

(10) Patent No.: US 8,300,075 B2
(45) Date of Patent: Oct. 30, 2012

(54) LASER DRIVING DEVICE, OPTICAL SCANNING DEVICE, AND IMAGE FORMING APPARATUS

(75) Inventors: Masaaki Ishida, Kanagawa (JP); Atsufumi Omori, Kanagawa (JP)

(73) Assignee: Ricoh Company, Limited, Tokyo (JP)

( * ) Notice: Subject to any disclaimer, the term of this patent is extended or adjusted under 35 U.S.C. 154(b) by 0 days.

(21) Appl. No.: 13/149,234

(22) Filed: May 31, 2011

(65) Prior Publication Data

US 2011/0304683 A1 Dec. 15, 2011

(30) Foreign Application Priority Data

Jun. 10, 2010 (JP) ................................. 2010-132727

(51) Int. Cl.
*B41J 2/47* (2006.01)
(52) U.S. Cl. ........................................ 347/239; 347/255
(58) Field of Classification Search .................. 347/246, 347/247, 228, 230, 236–240, 251–255
See application file for complete search history.

(56) References Cited

U.S. PATENT DOCUMENTS

| | | | | |
|---|---|---|---|---|
| 5,731,884 | A * | 3/1998 | Inoue ............................. | 358/3.06 |
| 5,949,526 | A * | 9/1999 | Koguchi ........................... | 355/47 |
| 6,323,888 | B1 * | 11/2001 | Iwamatsu et al. .............. | 347/131 |
| 6,423,964 | B2 * | 7/2002 | Nakaya et al. .................. | 250/234 |
| 6,927,789 | B2 | 8/2005 | Ozasa et al. | |
| 6,933,957 | B2 | 8/2005 | Omori et al. | |
| 7,030,899 | B2 * | 4/2006 | Hoshino et al. ............... | 347/236 |
| 7,205,501 | B2 * | 4/2007 | Arai et al. .................... | 219/121.7 |
| 7,212,224 | B2 | 5/2007 | Nihei et al. | |
| 7,256,815 | B2 | 8/2007 | Suzuki et al. | |
| 7,283,151 | B2 | 10/2007 | Nihei et al. | |
| 7,327,379 | B2 | 2/2008 | Nihei et al. | |
| 7,515,170 | B2 | 4/2009 | Omori et al. | |
| 7,701,480 | B2 | 4/2010 | Omori et al. | |
| 7,826,110 | B2 | 11/2010 | Tanabe et al. | |
| 7,834,902 | B2 | 11/2010 | Nihei et al. | |
| 7,920,305 | B2 | 4/2011 | Ishida et al. | |
| 7,936,493 | B2 | 5/2011 | Ishida et al. | |
| 8,000,211 | B2 * | 8/2011 | Shiozawa ....................... | 369/116 |
| 2005/0089069 | A1 | 4/2005 | Ozasa et al. | |
| 2005/0219354 | A1 | 10/2005 | Omori et al. | |
| 2007/0030548 | A1 | 2/2007 | Nihei et al. | |
| 2007/0132828 | A1 | 6/2007 | Ishida et al. | |
| 2008/0012933 | A1 | 1/2008 | Nihei et al. | |

(Continued)

FOREIGN PATENT DOCUMENTS

JP 63-197037 8/1988
(Continued)

*Primary Examiner* — Hai C Pham
(74) *Attorney, Agent, or Firm* — Oblon, Spivak, McClelland, Maier & Neustadt, L.L.P.

(57) ABSTRACT

A laser driving device in the embodiment includes: a laser light source that emits laser light; a light source drive control unit that adjusts a light amount of laser light emitted from the laser light source constant and controls on-off driving of the laser light source; a light amount adjustment element that is disposed in an optical path of laser light emitted from the laser light source and is capable of electrically changing transmittance or reflectance of the laser light that is entered thereinto; and a peak light amount control unit that controls the transmittance or the reflectance of the light amount adjustment element, so as to adjust a peak light amount of the laser light that is output from the light amount adjustment element after having traveled through or having been reflected by the light amount adjustment element.

9 Claims, 8 Drawing Sheets

U.S. PATENT DOCUMENTS

| | | |
|---|---|---|
| 2008/0042700 A1 | 2/2008 | Nihei et al. |
| 2008/0123160 A1 | 5/2008 | Omori et al. |
| 2008/0239336 A1 | 10/2008 | Tanabe et al. |
| 2008/0291259 A1 | 11/2008 | Nihei et al. |
| 2009/0091805 A1 | 4/2009 | Tanabe et al. |
| 2009/0167837 A1 | 7/2009 | Ishida et al. |
| 2009/0174915 A1 | 7/2009 | Nihei et al. |
| 2009/0195635 A1 | 8/2009 | Ishida et al. |
| 2009/0231656 A1 | 9/2009 | Suzuki et al. |
| 2009/0303451 A1 | 12/2009 | Miyake et al. |
| 2010/0045767 A1 | 2/2010 | Nihei et al. |
| 2010/0119262 A1 | 5/2010 | Omori et al. |
| 2010/0214637 A1 | 8/2010 | Nihei et al. |

FOREIGN PATENT DOCUMENTS

| | | |
|---|---|---|
| JP | 5-63283 | 3/1993 |
| JP | 2004-128342 | 4/2004 |
| JP | 2008-233115 | 10/2008 |
| JP | 2008-292956 | 12/2008 |

* cited by examiner

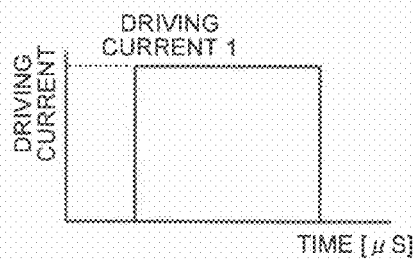
FIG.1A1
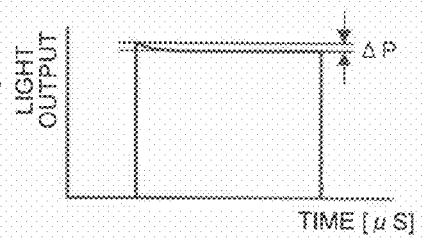
FIG.1A2
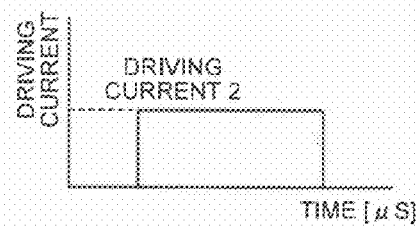
FIG.1B1
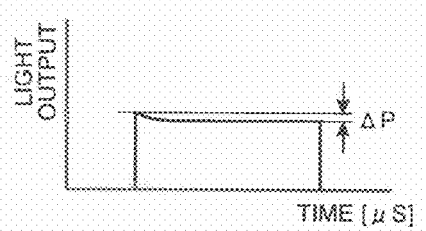
FIG.1B2
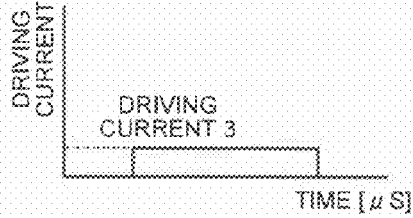
FIG.1C1
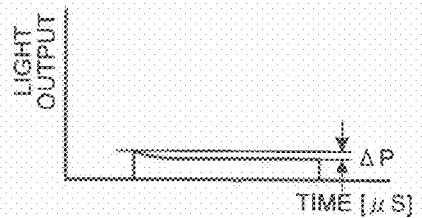
FIG.1C2

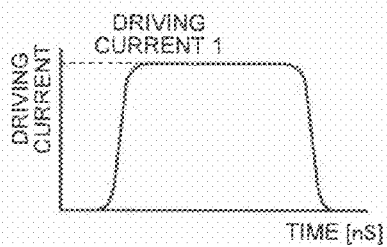
FIG.2A1
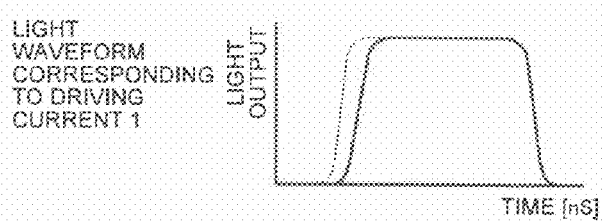
FIG.2A2
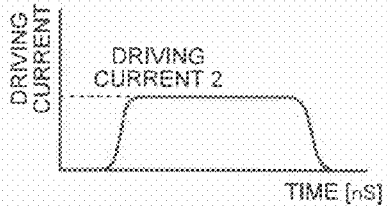
FIG.2B1
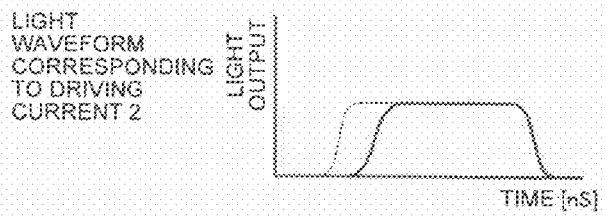
FIG.2B2
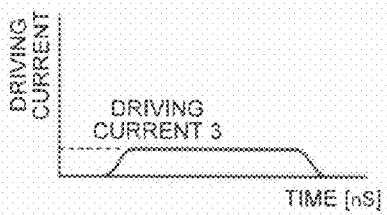
FIG.2C1
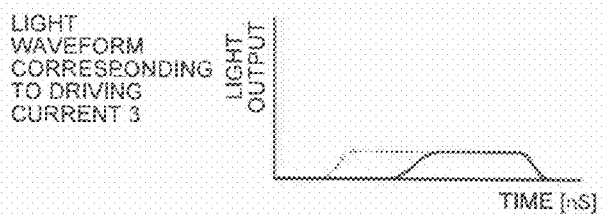
FIG.2C2

LASER DRIVING DEVICE, OPTICAL SCANNING DEVICE, AND IMAGE FORMING APPARATUS

CROSS-REFERENCE TO RELATED APPLICATIONS

The present application claims priority to and incorporates by reference the entire contents of Japanese Patent Application No. 2010-132727 filed in Japan on Jun. 10, 2010.

BACKGROUND OF THE INVENTION

1. Field of the Invention

The present invention relates to a laser driving device, an optical scanning device, and an image forming apparatus, and more specifically relates to a laser driving device including a semiconductor laser driving circuit that controls a light output from, for example, a light source of a laser printer, an optical disk device, a digital copying machine, an optical communications apparatus, and an optical scanning device including the laser driving device, and an image forming apparatus including the optical scanning device.

2. Description of the Related Art

In an electrophotography image forming apparatus, an optical scanning device is widely used that includes a laser driving device including a semiconductor laser serving as a light source and a driver driving the semiconductor laser. The optical scanning device generally adopts a method in which a photosensitive element is rotated and scanned with laser light deflected by a deflecting unit, such as a polygon mirror, provided so as to form a static latent image on the photosensitive element in an axial direction of the photosensitive element.

A typical driver for driving a semiconductor laser has both an adjustment function that adjusts the light amount of a semiconductor laser, a semiconductor laser array, or a vertical cavity surface emitting laser (VCSEL) and a function that modulates the laser with high speed. For example, in a color image forming apparatus, generally, an optimum light amount is selected according to efficiency of photosensitive elements of respective colors and an optical system, and a light source is on-off modulated with high speed at the light amount. Refer to the following examples of related art: Japanese Patent Application Laid-open No. S63-197037; Japanese Patent Application Laid-open No. H5-063283; Japanese Patent Application Laid-open No. 2004-128342; Japanese Patent Application Laid-open No. 2008-233115; and Japanese Patent Application Laid-open No. 2008-292956.

If an optimum light amount is to be selected by a semiconductor laser driver alone according to efficiency of photosensitive elements of respective colors and an optical system, light amount adjustment needs to be done over a wide range. For example, if efficiency of the optical system has a range from a minimum to a maximum that is twice the minimum while sensitivity variation of the photosensitive elements has a range from a minimum to a maximum that is twice the minimum, light adjustment needs to be done over a range from a minimum to a maximum that is four times the minimum. For example, if the maximum output power of a semiconductor laser is 10 mW, a dynamic range is needed from 2.5 mW to 10 mW, i.e., the maximum is four times the minimum in the range. As far as such range is concerned, the semiconductor laser driver can sufficiently fulfill the range with the dynamic range of the output current of the driver.

However, such a laser driving device has the following problem. When the driving current of a semiconductor laser fluctuates, i.e., a light output fluctuates, a laser characteristic, particularly, a droop characteristic fluctuates, causing a light waveform to fluctuate. Accordingly, density of images fluctuates when the images are formed by using laser light having different waveforms. As a result, images having stable uniform density cannot be achieved.

SUMMARY OF THE INVENTION

It is an object of the present invention to at least partially solve the problems in the conventional technology.

According to an aspect of the present invention, there is provided a laser driving device including: a laser light source that emits laser light; a light source drive control unit that adjusts a light amount of laser light emitted from the laser light source constant and controls on-off driving of the laser light source; a light amount adjustment element that is disposed in an optical path of laser light emitted from the laser light source and is capable of electrically changing transmittance or reflectance of the laser light that is entered thereinto; and a peak light amount control unit that controls the transmittance or the reflectance of the light amount adjustment element, so as to adjust a peak light amount of the laser light that is output from the light amount adjustment element after having traveled through or having been reflected by the light amount adjustment element.

According to another aspect of the present invention, there is provided an optical scanning device including the laser driving device mentioned above.

According to still another aspect of the present invention, there is provided an image forming apparatus including the optical scanning device mentioned above.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIGS. 1A1 to 1C2 are schematics illustrating droop characteristics of a typical semiconductor laser;

FIGS. 2A1 to 2C2 are schematics exemplarily illustrating high-speed optical response waveforms of the typical semiconductor laser;

DETAILED DESCRIPTION OF THE PREFERRED EMBODIMENTS

Figure 3:
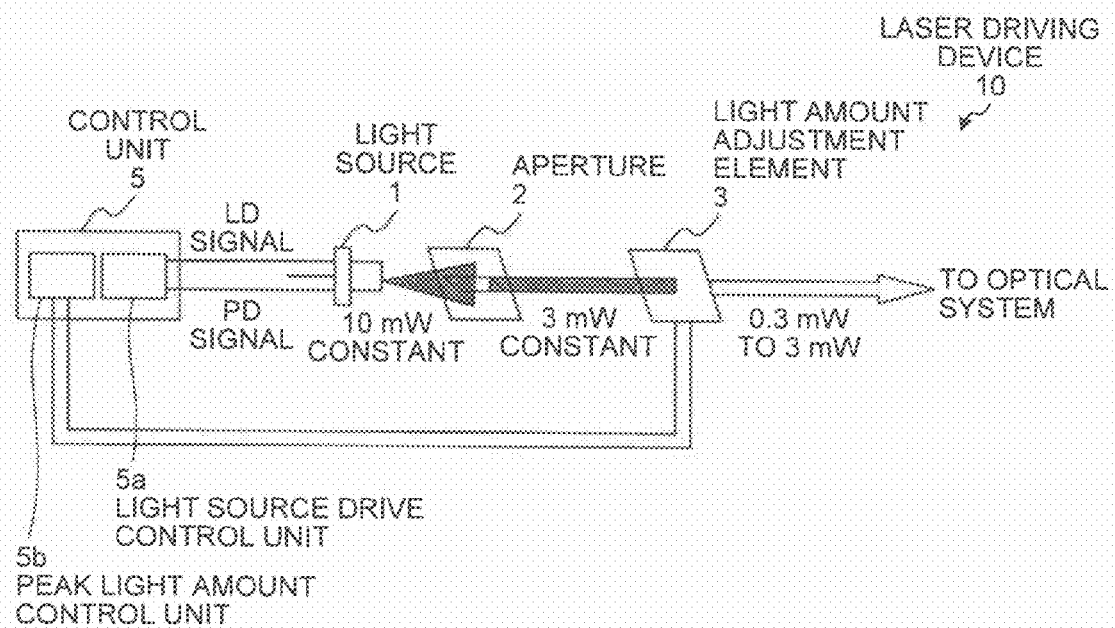
FIG. 3 is a schematic illustrating an exemplary structure of a laser driving device according to the present embodiment.

Characteristics of a laser and driving control of the laser are generally described below prior to the description of an embodiment according to the present embodiment. FIGS. 1A1 to 1C2 illustrate droop characteristics of a typical semiconductor laser. In FIGS. 1A1 to 1C2, illustrated are relations between driving current 1, 2, and 3 and waveforms of light outputs (light waveforms). The driving currents 1, 2, and 3 have three different driving current levels. In FIGS. 1A1 to 1C2, ΔP is roughly depicted as a same value regardless of the levels of the driving currents for ease of explanation. However, it is known that the value actually slightly fluctuates. The value, however, can be almost the same regardless of the levels of the driving currents because the fluctuation amount does not change with a driving current change, i.e., a peak light amount change.

In a typical laser, it is known that an absolute amount of a droop due to an efficiency drop caused by self-heating of the laser does not really depend on a light amount. Accordingly, as illustrated in FIGS. 1A1 to 1C2, the light outputs drop by almost the same power (ΔP) regardless of the levels of the driving currents. Because of almost the same power drop, the more influenced by the droop characteristic of the semiconductor laser is the smaller light amount one (a light output under a steady state); because a ratio of the power drop to a peak light amount (initial light output) becomes larger, i.e., a ratio of light amount fluctuation becomes larger.

In order to achieve a more uniform light amount, i.e., more uniform image density, it is preferable that the light amount of the semiconductor laser is increased so that the semiconductor laser is used in an operational condition in which the effect (ratio) of a droop with respect to a peak light amount is further reduced. For example, when a semiconductor laser is used in an image forming apparatus, the driving current 1 is suitable for achieving a uniform image density out of driving currents in FIGS 1A1, 1B1 and 1C1; because the driving current 1 has a large driving current value and a large light emission amount as illustrate in FIGS. 1A1 and 1A2, so that the droop value is relatively small. As a result, more stable images can be formed.

In the image forming apparatus, light use efficiency changes due to variations in lenses and in photosensitive element sensitivity, and aging of them. This change causes a light emission amount of the semiconductor laser to be changed. In such case, a condition such as the driving current 3 is selected, for example, because the driving current 3 produces light having a small light amount as illustrated in FIGS. 1C1 and 1C2, so that the image forming apparatus forms images with good light use efficiency. The condition, however, causes a peak value of a laser emission amount to fluctuate due to a larger effect of the droop characteristic of the semiconductor laser. As a result, image density fluctuates.

The changing of a light amount also causes an optical response waveform to change in a light output. For example, rising time (Tr), falling time (Tf), and the droop characteristic are changed in the optical response waveform so that fluctuation resultantly arises as a problem of image density fluctuation (refer to FIGS. 2A1 to 2C2).

FIGS. 2A1 to 2C2 exemplarily illustrate high-speed optical response waveforms of a semiconductor laser. In each of FIGS. 1A1 to 1C2, the abscissa axis represents time in microsecond (μs), and rising and falling patterns are depicted with straight lines. In FIGS. 2A1 to 2C2, exemplary optical response waveforms are illustrated that correspond to higher speed pulses having a short pulse width such as a pulse width of 10 nanoseconds (ns) to 20 nanoseconds (ns).

In such high-speed optical response, it is known that a semiconductor laser emits light having a different pulse width from that of a driving current though the semiconductor laser is driven with the driving current having a constant pulse width, as illustrated in FIGS. 2A1 to 2C2. One of the causes of the pulse width reduction is an oscillation delay phenomenon of a semiconductor laser. A delay amount is reduced when a sufficient bias current is supplied in advance. In contrast, a delay amount becomes larger, for example, when the semiconductor laser is driven from a state in which no driving current or a minute current is supplied, resulting in a pulse width of light being reduced. Another cause of the pulse width reduction is a low-pass filter effect caused by stray capacitance and a resistance component existing between the semiconductor laser and a driver. The low-pass filter effect causes the rising time Tr and the falling time Tf to be delayed, resulting in the pulse width being reduced.

Accordingly, when a light amount (light output) is small, such as the driving current 3 illustrated in FIGS. 2C1 and 2C2, the droop characteristic generally deteriorates and the rising time Tr and the falling time Tf that represent the high-speed response characteristic also deteriorate. When a vertical cavity surface emitting laser, such as VCSEL, is used, another characteristic may be obtained. However, it remains unchanged that the use of a laser with a constant light amount is the most stable way. For example, there is a technique that changes efficiency by using a plurality of neutral density (ND) filters to absorb changes of light use efficiency. The technique indeed can reduce a dynamic range somewhat. However, the light amount of a light source has no choice but to be changed for optimizing the light amount, causing light waveforms to fluctuate.

In this way, the peak light amount of the semiconductor laser indeed can be increased or decreased accordingly by increasing or decreasing the driving current. However, the following characteristics adversely affect the light waveform: the droop characteristic of the semiconductor laser and the high-speed response characteristic of the semiconductor laser and its system. Specifically, the peak light amount of the light waveform fluctuates due to the droop characteristic while the pulse width reduction occurs due to the high-speed response characteristic at high-speed response, even if the laser driver supplies a driving current having an ideal waveform. Such problems caused by the changing of the driving current need to be addressed to provide a high accuracy image forming apparatus.

Currently, in laser printers and copying machines, their use range (dynamic range) of light amount of light source is to require a wide range. The reasons are described below. A so-called laser printer or laser copying machine that writes images in photosensitive elements by scanning laser light generally needs to change a light amount of a light source in order to address the following efficiency fluctuations.

Fluctuation 1: Efficiency Fluctuation Due to Optical System

In general, efficiency of an optical system fluctuates in a range from a minimum to a maximum that is approximately twice the minimum due to variations of transmitted light in lenses and reflection from a polygon mirror. The optical variations need to be adjusted (absorbed) by changing the light amount of a laser because a laser power necessary for a photosensitive element depends on the photosensitive element.

Fluctuation 2: Process Efficiency Fluctuation Due to Photosensitive Element and the Like The sensitivity of the photosensitive element has variations. In addition, the photosensitive element deteriorates (an aging due to a long period use). Accordingly, the light amount of a light source needs to be adjusted also taking such factors into consideration. Particularly, in recent years, process control operation has been carried out in which an apparatus or a machine periodically checks temporal changes of the photosensitive element and development efficiency, and carries out autonomously adjustment for maintaining images at optimum density. The adjustment, however, is actually carried out by changing the light amount of a light source.

Fluctuation 3: Efficiency Fluctuation Between Apparatuses

Using of a common light source for various apparatuses has been widely adopted for promoting process simplification and cost reduction. In the apparatuses, the optical system efficiency and the process efficiency described above are not exactly the same, and productivity (e.g., print-out time) differs. Accordingly, a light output of a laser and a modulation speed are different from each other in the apparatuses. As a result, the actual waveforms and light amounts in use differ in the apparatuses for the above reasons.

As it now stands, a light amount dynamic range is required from a minimum to a maximum that is approximately ten times the minimum to absorb (correct or adjust) the variations and the system efficiency fluctuation. The change of a light waveform depending on a light amount will need to be addressed because a correction range will become large.

Furthermore, color copying machines have the following issues on image stability depending on a light waveform of a light source. In a typical example of such color copying machines, photosensitive elements are individually provided for respective colors to avoid low productivity (low processing speed) when a single photosensitive element is used alone to produce colors. The efficiency and aging states of optical systems of the respective colors and the photosensitive elements are different from each other, resulting in varying outputs of light sources of the respective colors generally. A color image is formed by supplying respective color toner to the respective photosensitive elements. The photosensitive elements, however, have different accumulative light amounts and their distributions that are formed by the light waves because the light waveforms are different from each other when the outputs of light sources are different from each other. Accordingly, color and density of the color image fluctuate due the variation of the waveforms. The effect of the waveform variation is relatively indistinguishable when an image region is large because the effect is integrated in the region. In contrast, the effect of the waveform variation is distinguishable when a highlight image is formed particularly by combining small size pixels, for example. Even in an image having a large image region, density change may occur due to the effect of a long period characteristic such as the droop characteristic of a laser. In other words, the color copying machines have larger problems with image stability than the black-and-white copying machines.

The inventors have been dedicated to examinations for solving the above-described issues, and have completed a laser driving device including a semiconductor laser that is used with a constant light output and on a high power side in which the semiconductor laser has no droop characteristic and a good optical response waveform, and a unit that adjusts (attenuates) a light amount after light emission, and an optical scanning device provided with the laser driving device. In addition, the inventors have realized an image forming apparatus that can stably form images having few image density fluctuations by using the optical scanning device. A laser driving device, an optical scanning device, and an image forming apparatus according to the present embodiment are described below.

FIG. 3 is a schematic illustrating an exemplary structure of a laser driving device according to the present embodiment. A laser driving device 10 includes a light source 1, a light source drive control unit 5a, a light amount adjustment element 3, and a peak light amount control unit 5b as illustrated in FIG. 3. The light source 1 is a semiconductor laser that emits laser light. The light source drive control unit 5a controls on-off driving over the light source 1 so as to maintain the light amount of laser light emitted from the light source 1 constant. The light amount adjustment element 3 is disposed in the optical path of laser light emitted from the light source 1, and is capable of electrically changing transmittance of laser light traveling inside of the light amount adjustment element 3. The peak light amount control unit 5b controls transmittance of laser light traveling inside of the light amount adjustment element 3 according to optical characteristics of optical parts (an optical system) into which laser light emitted from the laser driving device 10 enters, and adjusts the peak light amount of laser light traveling inside of and being emitted from the light amount adjustment element 3. The light source drive control unit 5a and the peak light amount control unit 5b are included in a control unit 5 that is a control device or a driver.

The light source 1 constantly emits light with a predetermined output power(e.g., 10 mW) under which good droop and high-speed response characteristics are achieved, using a driving current (LD signal) and a photo detector (PD) signal for the light source 1 that are supplied from the light source drive control unit 5a. The light emission state corresponds to the state of the driving current 1 illustrated in FIGS. 1A1, 1A2, 2A1, and 2A2, for example.

An aperture 2 that regulates the light amount of laser light emitted from the light source 1 to a predetermined amount is provided between the light source 1 and the light amount adjustment element 3. In FIG. 3, laser light having a power of 10 mW is output and regulated to be laser light having a constant power of 3 mW. An optical element such as a collimator lens may be disposed when needed.

When the light source 1 is a multiple light source composed of a plurality of light-emitting elements, such as a laser diode array (LDA) and a vertical cavity surface emitting laser (VCSEL), the light source drive control unit 5a preferably controls on-off driving of the light source 1 in which each light emission amount of the light-emitting elements has been adjusted to a predetermined value.

The light amount adjustment element 3 is an optical element in which the internal transmittance is changed base on a signal from the peak light amount control unit 5b (being electrically controlled), so that laser light from the aperture 2 can be emitted as laser light having a desired peak light amount (light amount necessary for an optical system of the image forming apparatus). For example, in the light amount adjustment element 3 of FIG. 3, the transmittance can be adjusted in such a manner that incident laser light having a power of 3 mW is adjusted to any value in a range from 0.3 mW to 3 mW by traveling through inside of the light amount adjustment element 3 so as to be emitted.

It is preferable that the light amount adjustment element 3 is capable of changing the internal transmittance electrically at least within one second in order to address the three efficiency fluctuations described above (fluctuations 1 to 3). It is preferred that the light amount adjustment element 3 is any one of a liquid crystal polarization element, a variable neutral density (ND) element (serial ND element), an acoustic optical element, and a Faraday element.

Figure 4:
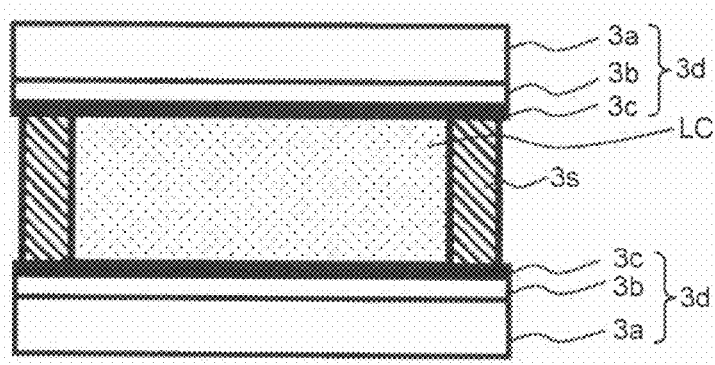
FIG. 4 is a cross sectional view illustrating a structure of a liquid crystal polarization element serving as a light amount adjustment element.

Any liquid crystal polarization element is usable that is generally used for applications of televisions, video recorders, and finders of cameras, for example. In the liquid crystal polarization element illustrated in FIG. 4 as an example, a pair of substrates 3d is disposed with a spacer 3s interposed between the substrates 3d, and a liquid crystal layer LC being filled inside an inner space formed by the substrates 3d and spacer 3s. Each substrate 3d is composed of a transparent substrate 3a such as silica glass, a transparent electrode 3b such as indium tin oxide (ITO) layered on the transparent substrate 3a, and a transparent alignment film 3c layered on the transparent electrode 3b. The substrates 3d are disposed so that the alignment films 3c are faced to each other. In the liquid crystal polarization element, liquid crystal alignment in the liquid crystal layer LC is changed by changing a voltage applied between the electrodes 3b so as to change the whole internal transmittance. Employing the liquid crystal polarization element as the light amount adjustment element 3 can realize a more stable laser driving device with lower costs. In addition, the liquid crystal polarization element is a preferred element for the multiple light source such as the LDA and VCSEL because the liquid crystal polarization element having a large area can be relatively easily obtained.

Figure 5A:
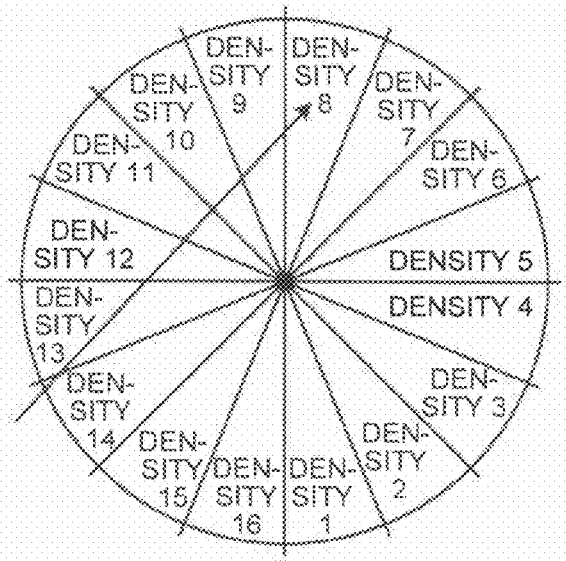
FIGS. 5A and 5B are schematics illustrating structures of variable ND elements serving as a light amount adjustment element.

An example of the variable ND element is an element that is a rotating body composed of ND filters whose transmitted light amounts can be continuously adjusted. The element is rotated by a stepping motor, for example. A peak light amount of laser light after traveling in the ND filters can be adjusted by controlling a rotational amount of the element. The ND element in which density continuously changes in an analog manner is not suitable for the multiple light source such as the LDA and VCSEL, because its area having predetermined transmissive efficiency is small. In contrast, as illustrated in FIG. 5A, the ND element in which transmissive efficiency can be changed in a digital manner has no such problem, and can realize the present embodiment. In the variable ND element exemplarily illustrated in FIG. 5A, a disk serving as a rotating body has 16 partitions angularly divided from the center of the disk, and the ND filters having different density are arranged in divided regions (each divided angle is 22.5 degrees). The transmittance can be changed by rotating the disk. In this regard, it is easier to change a setting value (transmittance value) in an analog manner if a larger number of partitions than 16 are provided on the disk. For example, around 256 or more steps (256 values represented by 8 bits) are preferably provided.

Figure 5B:
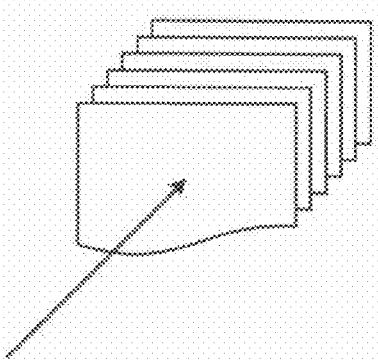

The variable ND element illustrated in FIG. 5B is an example in which a plurality of ND filters having different density are overlapped so as to obtain a desired transmitted light amount. For example, one or a plurality of ND filters are selected as desired, and arranged in the optical path of incident laser light. As a result, desired density (transmittance) can be realized.

Variable density can be realized by applying a plurality of such ND filters each having fixed transmissive efficiency and continuously switching the ND filters by a driving system. Employing the variable ND element as the light amount adjustment element 3 can realize a more stable laser driving device more easily with lower costs.

The Acousto-Optic Modulator element (AOM element) is composed of an acoustic optical medium and a piezoelectric element adhesively bonded to the acoustic optical medium. The Acousto-Optic Modulator element serves as an optical modulation element (or an optical deflection element, or an acoustic optical filter) to produce modulated transmitted light as follows: an electrical signal is applied to the piezoelectric element so as to generate ultrasonic waves that diffract laser light traveling in the inside of the piezoelectric element. In the modulation, transmittance of laser light can be changed by amplitude-modulating laser light with a constant frequency of the piezoelectric element. When the AOM element is used as the optical deflection element or the acoustic optical filter, intensity of emitted laser light is adjusted by frequency modulation and amplitude modulation.

Employing the acoustic optical element as the light amount adjustment element 3 can realize a high-speed and high-performance laser driving device. In general, the acoustic optical medium is made of a single crystal. A large size crystal is required when the AOM element is used for the multiple light source.

Figure 6:
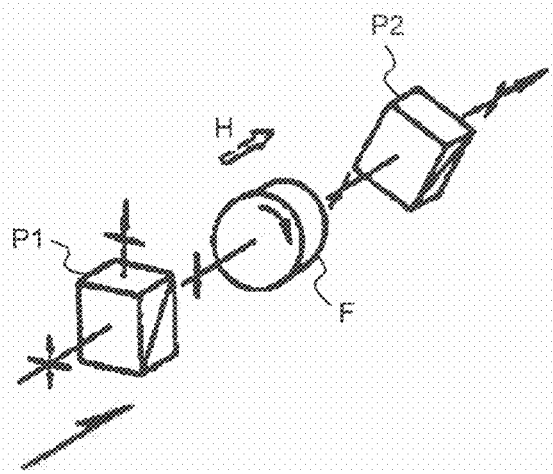
FIG. 6 is a schematic illustrating a structure of a Faraday element serving as a light amount adjustment element.

The Faraday element polarizes light by magnetic Kerr rotation of a nonlinear optical element with a magnetic field applied to the nonlinear optical element, and is used as a filter. For example, as illustrated in FIG. 6, a Faraday optical rotator F is provided between polarizers P1 and P2. The rotation of the Faraday optical rotator F is made by and adjusted by a magnetic field H so as to change transmittance of laser light. Employing the Faraday element as the light amount adjustment element 3 can realize a high-speed and high-performance laser driving device.

Figure 7A:
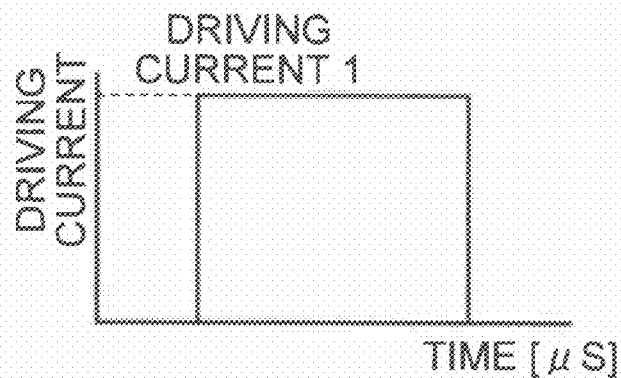
FIGS. 7A to 7C are schematics illustrating a droop characteristic of laser light of the laser driving device of the present embodiment.
Figure 7B:
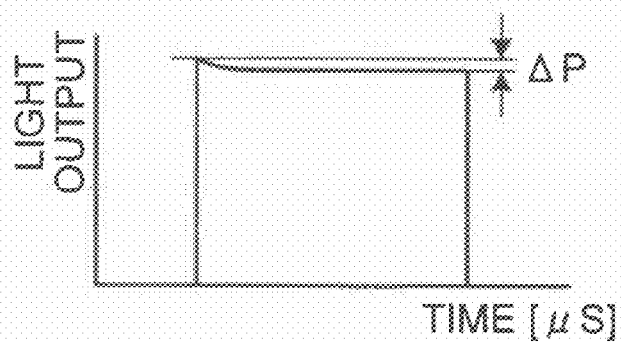
Figure 7C:
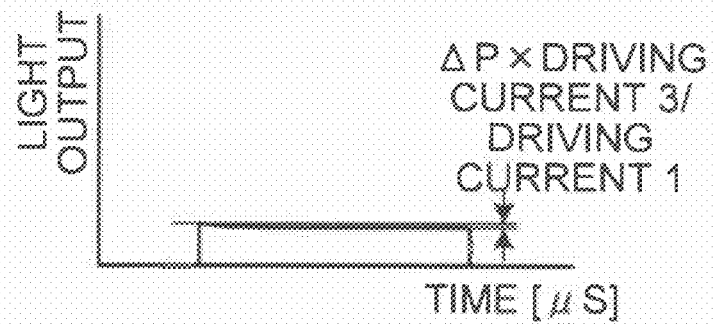
Figure 8A:
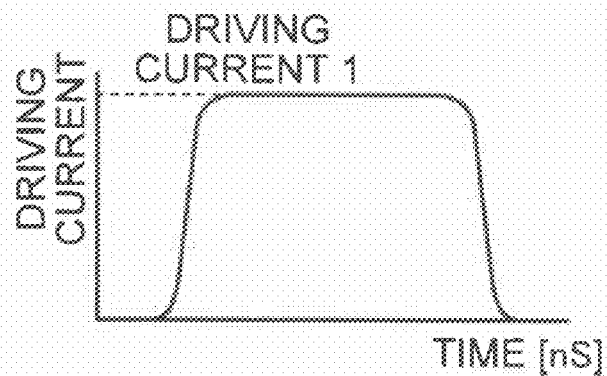
FIGS. 8A to 8C are schematics to describe exemplary high-speed optical response waveforms of laser light of the laser driving device of the present embodiment.
Figure 8B:
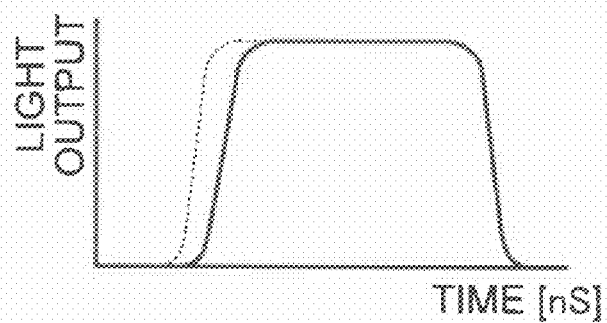
Figure 8C:
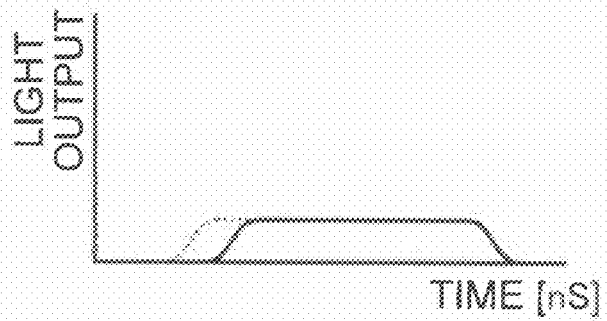

FIGS. 7B, 7C, 8B and 8C illustrate output waveforms of light emitted from the laser driving device 10. FIGS. 7B and 7C illustrate the droop characteristics of output waveforms of light emitted from the laser driving device 10. FIGS. 8B and 8C illustrate high-speed optical response waveforms of light emitted from the laser driving device 10. In the laser driving device 10, laser light is output after completing the following steps when laser light having the same light output as illustrated in FIGS. 1C1 and 1C2 (condition of the driving current 3) is output.

S1: the LD signal of the driving current 1 as illustrated in FIGS. 7A and 8A is constantly input into the light source 1 from the light source drive control unit 5a.

S2: the light source 1 emits laser light as illustrated in FIGS. 7B and 8B. As illustrated in FIG. 7A, the light output of laser light drops from the initial light output by ΔP and becomes a steady light output. As illustrated in FIG. 8B, the pulse width of the waveform is reduced due to a predetermined delay of laser oscillation.

S3: laser light emitted from the light source 1 enters the aperture 2 in which the light amount of the laser light is regulated to a predetermined amount, and thereafter enters the light amount adjustment element 3.

S4: the incident laser light is attenuated and output by the light amount adjustment element 3 in which the internal transmittance has been adjusted to a predetermined value by the peak light amount control unit 5b. At step S4, the light waveforms illustrated in FIGS. 7B and 8B are merely attenuated and output as output waveforms illustrated in FIGS. 7C and 8C. In other words, as illustrated in FIG. 7C, the peak fluctuation value of the light output due to the droop characteristic is reduced to ΔP×driving current 3/driving current 1. The effect of the droop characteristic becomes small in proportion to the amplitude of the light output. As illustrated in FIG. 8C, laser oscillation delay remains unchanged in the high-speed optical response waveform, and thus the pulse width of the light output is the same as that of the waveform of FIG. 8B. The light amount alone becomes small.

As described above, in the laser driving device 10 of the present embodiment, the light source 1 emits laser light having good droop and high-speed optical response characteristics with a constant output power, and thereafter the laser light is attenuated and is output by the light amount adjustment element 3. In the light amount adjustment element 3, laser light is merely attenuated without deteriorating the good droop and high-speed optical response characteristics. Accordingly, a light output waveform of laser light emitted from the laser driving device 10 is highly stable compared with the conventional waveforms as illustrated in FIGS. 1A1 to 1C2, and 2A1 to 2C2.

A light amount of laser light emitted from the laser driving device 10 may be monitored by a transmissive photo-detector (PD); and information monitored by the PD may be fed back to the peak light amount control unit 5b to control the output light amount constant.

Figure 9:
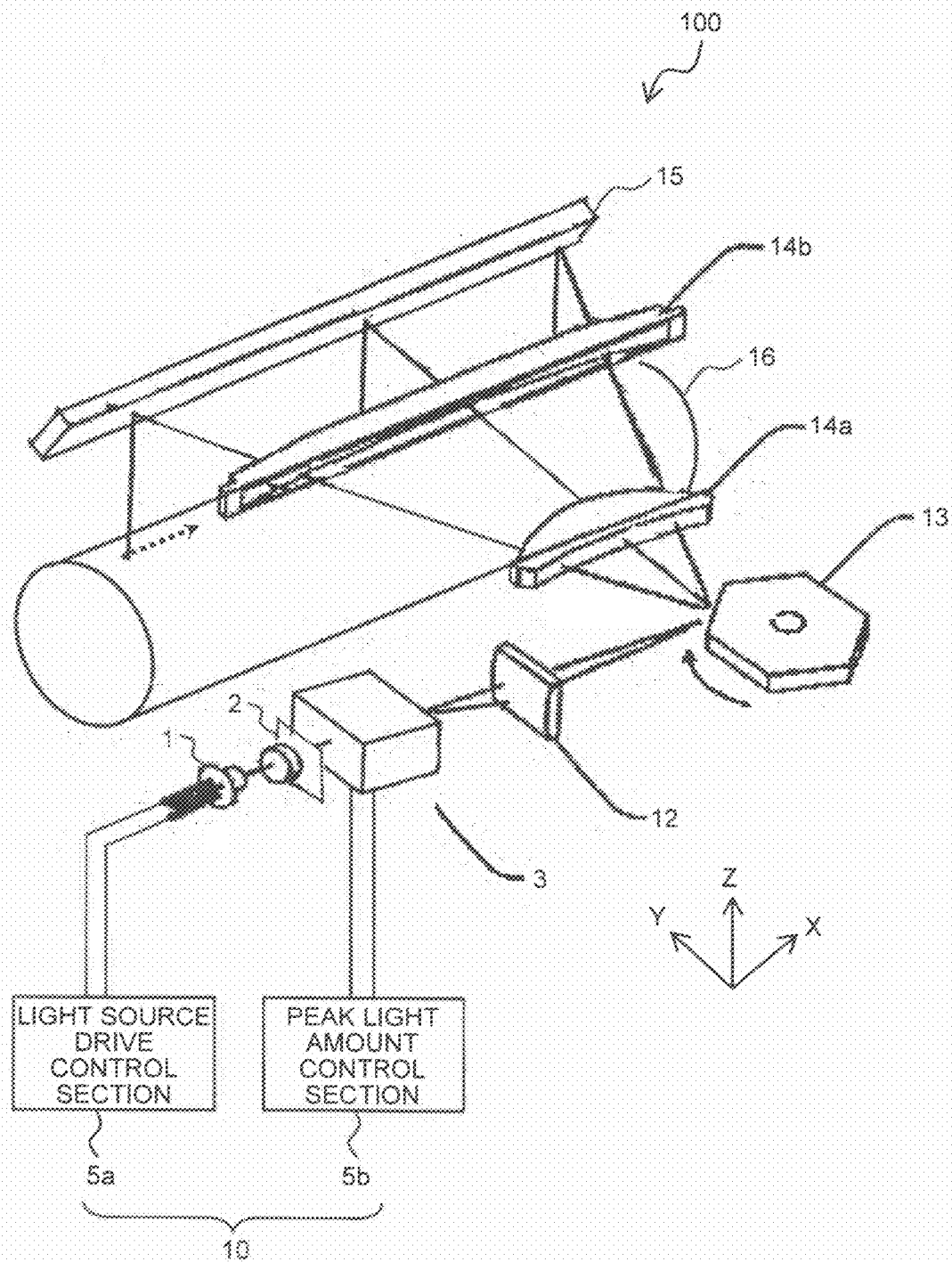
FIG. 9 is a schematic illustrating an exemplary structure of an optical scanning device according to the present embodiment.

A structure of an optical scanning device according to the present embodiment is described below. FIG. 9 is a schematic illustrating a structure of the optical scanning device according to the present embodiment. As illustrated in FIG. 9, an optical scanning device 100 includes the laser driving device 10 of the present embodiment, a cylindrical lens 12, a polygon mirror 13, a deflector side scanning lens 14a, an image plane side scanning lens 14b, a turning-back mirror 15, and an optical housing (not illustrated) to which these elements are mounted at their predetermined positions. The laser driving device 10 includes the light source 1, the aperture 2, the light amount adjustment element 3, the light source drive control unit 5a, and the peak light amount control unit 5b. The polygon mirror 13 is a scanning unit that deflects laser light in a main-scanning direction. The deflector side scanning lens 14a and the image plane side scanning lens 14b are fθ lenses and form an imaging optical system. The turning-back mirror 15 directs laser light toward a photosensitive element 16. An optical housing is provided to house these units described above therein at respective predetermined position.

In the embodiment, a direction along an optical axis of the cylindrical lens 12 is defined as an X-axis direction, and a direction in parallel with a rotational axis of the polygon mirror 13 is defined as a Z-axis direction in an XYZ three-dimensional orthogonal coordinate system. In addition, a direction corresponding to a main-scanning direction is shortly referred to as the "main-scanning direction" while a direction corresponding to a sub-scanning direction is shortly referred to as a "sub-scanning direction" hereinafter for the sake of convenience.

As illustrated in FIG. 9, in the optical scanning device 100, laser light emitted from the laser driving device 10 is converged by the cylindrical lens 12 in the sub-scanning direction so as to enter a deflection reflection surface (also simply referred to as a reflection surface) of the polygon mirror 13 rotating as the scanning unit. Laser light reflected by the deflection reflection surface is deflected in a uniform angular velocity according to uniform velocity rotation of the polygon mirror 13. The deflected laser light travels through the scanning lenses 14a and 14b, and thereafter is directed to the backward direction by the turning-back mirror 15 so as to be converged on a surface being scanned of the photosensitive element 16. In this way, laser light emitted from the laser driving device 10 is imaged on a surface being scanned as a light spot so as to scan the surface.

The optical scanning device 100 structured as described above can utilize laser light having a highly stable light waveform that is not obtained by the conventional structure in which the driving current of the light source 1 is changed, because the optical scanning device 100 uses the laser driving device 10 of the present embodiment. As a result, the optical scanning device 100 can realize stable optical writing without depending on the characteristics of a semiconductor laser.

Figure 10:
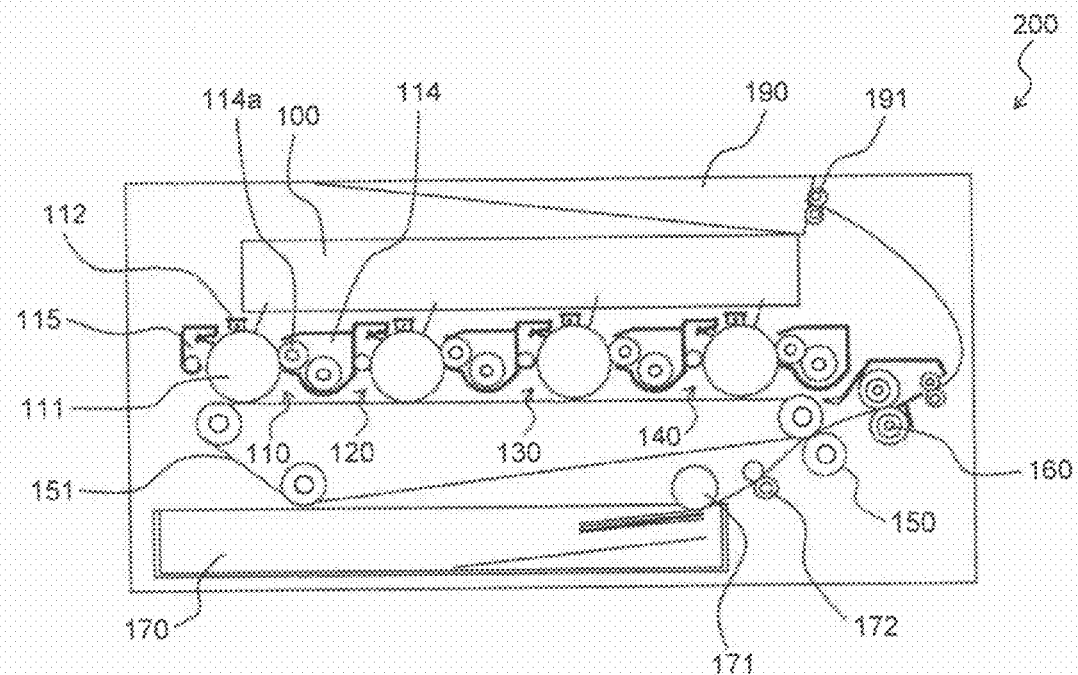
FIG. 10 is a schematic illustrating an exemplary structure of an image forming apparatus according to the present embodiment.

A structure of an image forming apparatus according to the present embodiment is described below. FIG. 10 is a whole side view illustrating a structure of the image forming apparatus according to the present embodiment. The image forming apparatus uses the optical scanning device of the present embodiment. In FIG. 10, an image forming apparatus 200 serving as an electrophotography apparatus includes image forming units 110, 120, 130, and 140 for respective colors that are arranged on an intermediate transfer belt 151. A color image is formed on the intermediate transfer belt 151 with toner. The toner color image is transferred to a sheet that serves as a recording medium, and is conveyed from a paper feeding device 170. The color toner image transferred on the sheet is formed as a color image by a fixing device 160 in which toner is melt and fixed with heat and pressure.

The four image forming units are also specifically referred to as a K image forming unit 110 having black toner, a C image forming unit 120 having cyan toner, an M image forming unit 130 having magenta toner, and a Y image forming unit 140 having yellow toner.

The image forming unit 110, which is described as an example of the four units, includes a photosensitive element 111 (the photosensitive element 16 illustrated in FIG. 9), and a charging unit 112, a developing unit 114, and a cleaning unit 115 that are disposed around the photosensitive element 111. The charging unit 112 charges a surface of the photosensitive element 111 to a high voltage. The developing unit 114 supplies charged toner from a developing roller 114a to a static latent image recorded on the photosensitive element 111 by optical writing carried out by the optical scanning device 100 of the present embodiment based on input image data, thereby causing the toner to stick to the static latent image to visualize the static latent image. The cleaning unit 115 scrapes toner remaining on the photosensitive element 111 so as to store the scraped toner therein. The image forming units 120, 130, and 140 have the same structure as the image forming unit 110. It is recommended that the positional deviation correction of scanning line carried out in real time by the optical scanning device 100 as described above is applied to all of the image forming units 110, 120, 130, and 140.

The intermediate transfer belt 151 is an endless belt that is held in a stretched condition and moved with a circular motion with a plurality of rollers, and makes contact with the photosensitive elements of the image forming units 110, 120, 130, and 140, and a secondary transfer roller 150. A primary transfer roller (not illustrated) is disposed at a side adjacent to a back surface of the intermediate transfer belt 151 so as to face the photosensitive element 111, for example.

Sheets piled up in the paper feeding device 170 are pulled out by a pickup roller 171 piece by piece. A pulled out sheet is conveyed through a registration roller 172, and then makes contact with the intermediate transfer belt 151 while being pressed with the secondary transfer roller 150 and a counter roller of the secondary transfer roller 150, so that an image is transferred on the sheet. The sheet after transfer is conveyed with the conveying belt to the fixing device 160.

In the fixing device 160, a fixing member heated to a predetermined temperature and a pressing member are abutted with a predetermined pressure so as to form a nip. Heat and pressure is applied to a sheet when the sheet passes through the nip.

The image forming apparatus 200 forms an image in the following manner, for example. The charging unit 112 charges the surface of the photosensitive element 111 in the image forming unit 110. The optical scanning device 100 irradiates light according to an image to the photosensitive element 111 so as to drop potential of the surface of the photosensitive element 111. The irradiated area reaches the developing unit 114 by rotation of the photosensitive element 111. When the photosensitive element 111 makes contact with a toner layer on the developing roller 114a, charged toner sticks to the image formed on the photosensitive element 111.

The toner image formed on the photosensitive element 111 is transferred on the intermediate transfer belt 151 at a position where the primary transfer roller pushes the intermediate transfer belt 151 toward the photosensitive element 111. The toner images on the respective photosensitive elements are transferred on the intermediate transfer belt 151 in the respective image forming units 120, 130, and 140 in the same manner as the image forming unit 110. As a result, a color toner image is formed on the intermediate transfer belt 151. The color toner image is conveyed by the intermediate transfer belt 151 to a position at which the secondary transfer roller 150 is disposed, and transferred on a conveyed sheet at the position. The sheet on which the color toner image has been transferred is conveyed to the fixing device 160, in which color toner is melt by heat and fixed by pressure so as to form a color image. Thereafter, the sheet is discharged to a discharge tray 190 by a discharging roller 191.

It is recommended that the transmittance of the light amount adjustment element 3 of the laser driving device 10 included in the optical scanning device 100 is adjusted based on image density information. The image density information is obtained as a result of measuring image density of an actually formed image by using a density detection sensor, during process control operation that is periodically carried out by the apparatus, for example. In the present embodiment, the peak light amount control unit 5b adjusts the light amount adjustment element 3 so that an image is formed with desired density, based on the image density information. As a result, the above-described fluctuations 1001 to 1003 can be simultaneously corrected. The fluctuation 1001 is characteristic fluctuation of an optical system (efficiency fluctuation). The fluctuation 1002 is process efficiency fluctuation (sensitivity variation or process aging) of photosensitive elements, for example. The fluctuation 1003 is efficiency fluctuation between apparatuses. In the adjustment, no light amount of the light source 1 is changed. As a result, a stable square waveform having a good shape can be achieved as a light waveform. In order to achieve the stable square waveform, it is needed that transmittance can be changed to desired transmittance within a desired period of time, i.e., transmittance continuously dynamically changing function is needed. The function can also be used for shading characteristic correction depending on a speed of the dynamic change.

As described above, the image forming apparatus of the present embodiment can form high quality images because the image forming apparatus uses the optical scanning device 100 of the present embodiment so as to enable accurate optical scanning to be carried out. Particularly, when the present embodiment is applied to color laser printers and color digital copying machines, high quality color images can be formed with few color deviations.

Though the present embodiment is described based on the embodiment illustrated in the drawings, the present embodiment is not limited to the embodiment illustrated in the drawings. The embodiment can be changed by deleting part thereof or adding another embodiment within a range where a person in the art can achieve. Any aspects are included in the range of the present embodiment as long as the aspects exhibit the operations and effects of the present embodiment.

Figure 11:
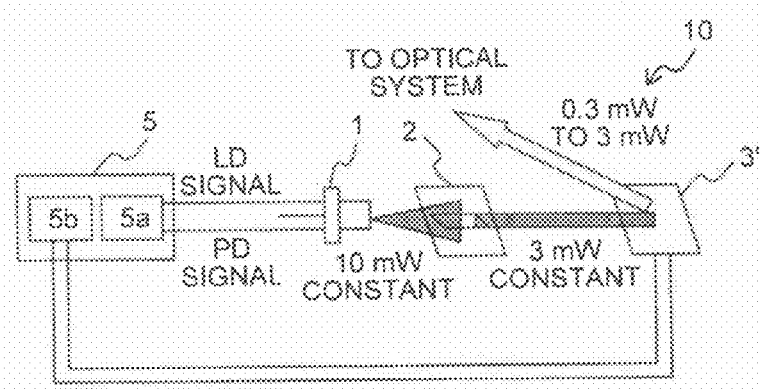
FIG. 11 is a schematic illustrating another exemplary structure of the laser driving device according to the present embodiment.

For example, as illustrated in FIG. 11, the laser driving device 10 of the present embodiment may include the light source 1, the light source drive control unit 5a, and a light amount adjustment element 3', and the peak light amount control unit 5b. The light source 1 emits laser light. The light source drive control unit 5a controls on-off driving of the light source 1 so as to maintain the light amount of laser light emitted from the light source 1 constant. The light amount adjustment element 3' that is disposed in the optical path of laser light emitted from the light source 1 and is capable of changing reflectance of laser light entering the light amount adjustment element 3' electrically. The peak light amount control unit 5b adjusts the peak light amount of laser light reflected by the light amount adjustment element 3' by controlling reflectance of the light amount adjustment element 3'. In this case, it is preferable that the light amount adjustment element 3' is capable of changing reflectance electrically at least within one second in order to address the above-described three efficiency fluctuations (fluctuations 1001 to 1003). For example, a reflective liquid crystal polarization element can be used as the light amount adjustment element 3'.

In the laser driving device 10 structured as above, the light source 1 emits laser light having good droop and high-speed optical response characteristics with a constant output power, and thereafter the laser light is attenuated and output by the light amount adjustment element 3'. In the light amount adjustment element 3', laser light is merely attenuated without deteriorating the good droop and high-speed optical response characteristics. Accordingly, a light output waveform of laser light emitted from the laser driving device 10 is highly stable compared with the conventional waveforms illustrated in FIGS. 1A1 to 1C2, and 2A1 to 2C2.

In the laser driving device of the present embodiment, a light source emits laser light having good droop characteristics and high-speed optical response characteristics with a constant output power, and the laser light is attenuated and output by the light amount adjustment element. In the light amount adjustment element, laser light is merely attenuated without deteriorating the good droop characteristics and high-speed optical response characteristics. Accordingly, the same light waveform can be constantly produced at any light amount; and significantly stable laser driving can be realized.

In addition, the optical scanning device of the present embodiment can realize stable optical writing without depending on the characteristics of a semiconductor laser, because the optical scanning device uses the laser driving device of the present embodiment so as to enable laser light having significantly stable light waveforms to be utilized.

Furthermore, the image forming apparatus of the present embodiment can form high quality images because the image forming apparatus uses the optical scanning device of the present embodiment so as to enable accurate optical scanning to be carried out. Particularly, when the present embodiment is applied to color laser printers and color digital copying machines, high quality color images can be formed with few color deviations.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A laser driving device, comprising:
a laser light source that emits laser light;
a light source drive control unit that adjusts a light amount of laser light emitted from the laser light source constant and controls on-off driving of the laser light source;
a light amount adjustment element that is disposed in an optical path of laser light emitted from the laser light source and is configured to electrically change transmittance or reflectance of the laser light that is entered thereinto based on an image density measured from a formed image by a density detection sensor; and
a peak light amount control unit that controls the transmittance or the reflectance of the light amount adjustment element, so as to adjust a peak light amount of the laser light that is output from the light amount adjustment element after having traveled through or having been reflected by the light amount adjustment element.

2. The laser driving device according to claim 1, wherein the laser light source includes a plurality of light-emitting elements, and
the light source drive control unit adjusts each light emission amount of each of the light-emitting elements to be a certain value and controls on-off driving of the laser light source having the light emitting elements each of whose light emission amount is adjusted to be the certain value.

3. The laser driving device according to claim 1, wherein the light amount adjustment element is of any one of a liquid crystal polarization element, a variable neutral density element, an acoustic optical element, and a Faraday element.

4. The laser driving device according to claim 1,
wherein the laser light emitted from the laser light source is not adjusted concurrently with controlling, by the peak light amount control unit, the light amount adjustment element to adjust the transmittance or the reflectance.

5. An optical scanning device, comprising a laser driving device, wherein
the laser driving device includes:
a laser light source that emits laser light;
a light source drive control unit that adjusts a light amount of laser light emitted from the laser light source constant and controls on-off driving of the laser light source;
a light amount adjustment element that is disposed in an optical path of laser light emitted from the laser light source and is configured to electrically change transmittance or reflectance of the laser light that is entered thereinto based on an image density measured from a formed image by a density detection sensor; and
a peak light amount control unit that controls the transmittance or the reflectance of the light amount adjustment element, so as to adjust a peak light amount of the laser light that is output from the light amount adjustment element after having traveled through or having been reflected by the light amount adjustment element.

6. The optical scanning device according to claim 5,
wherein the laser light emitted from the laser light source is not adjusted during an image forming operation.

7. An image forming apparatus, comprising an optical scanning device, that includes a laser driving device, wherein the laser driving device includes:
a laser light source that emits laser light;
a light source drive control unit that adjusts a light amount of laser light emitted from the laser light source constant and controls on-off driving of the laser light source;
a light amount adjustment element that is disposed in an optical path of laser light emitted from the laser light source and configured to electrically change transmittance or reflectance of the laser light that is entered thereinto based on an image density measured from a formed image by a density detection sensor; and
a peak light amount control unit that controls the transmittance or the reflectance of the light amount adjustment element, so as to adjust a peak light amount of the laser light that is output from the light amount adjustment element after having traveled through or having been reflected by the light amount adjustment element.

8. The image forming apparatus according to claim 7, wherein
the peak light amount control unit controls the transmittance or the reflectance of the light amount adjustment element based on a deviation of the measured image density, so as to adjust a peak light amount of laser light that is emitted from the light amount adjustment element.

9. The image forming apparatus according to claim 7,
wherein the laser light emitted from the laser light source remains constant during an image forming operation.

* * * * *